US006825503B2

(12) United States Patent
     Huang

(10) Patent No.: US 6,825,503 B2
(45) Date of Patent: Nov. 30, 2004

(54) LENS CAP FOR SEMICONDUCTOR LASER PACKAGE

(75) Inventor: Nan Tsung Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 85 days.

(21) Appl. No.: 10/165,743

(22) Filed: Jun. 6, 2002

(65) Prior Publication Data

US 2003/0198275 A1 Oct. 23, 2003

(30) Foreign Application Priority Data

Apr. 18, 2002 (TW) ...................................... 91205240 U

(51) Int. Cl.[7] .............................................. H01L 29/22
(52) U.S. Cl. ......................................... 257/99; 372/109
(58) Field of Search ........................... 372/109; 257/99, 257/98, 81, 82, 680

(56) References Cited

U.S. PATENT DOCUMENTS 4,354,105 A * 10/1982 Spirig ..................... 250/231.1
5,825,054 A * 10/1998 Lee et al. ..................... 257/98
5,953,355 A *  9/1999 Kiely et al. ................... 372/43
6,479,889 B1 * 11/2002 Yoshida et al. ............. 257/678

* cited by examiner

Primary Examiner—Minhloan Tran
Assistant Examiner—Leonardo Andújar
(74) Attorney, Agent, or Firm—Wei Te Chung

(57) ABSTRACT

A lens cap (40) in accordance with a preferred embodiment of the present invention for a semiconductor laser package (not shown) includes an optical element (31) made of a plastic material and a housing (20). The housing includes a top portion (21), a cylindrical sidewall (25) and an annular flange 22. An opening (23) is defined in the top portion. A ridge (24) is formed along an edge of the opening and protrudes into the opening. The optical element is insert molded into the housing, providing a strong structure which is not easily damaged, while still allowing transmittal of light through the opening. Since the optical element is made of a plastic material, the lens cap is comparatively inexpensive.

6 Claims, 5 Drawing Sheets

LENS CAP FOR SEMICONDUCTOR LASER PACKAGE

BACKGROUND OF THE INVENTION

1. Field of the Invention

The present invention relates to lens caps, and especially to an integrally formed lens cap for a semiconductor laser package.

2. Related Art

Since the development of laser diodes, many applications for their use have been developed. Increasingly, laser diodes are employed for communications and are integral to optical disc recording and storage systems. However, laser diodes are fragile, and undue mechanical impact and humidity can affect their performance. To protect them from damage, laser packages are designed.

A conventional semiconductor laser package includes a base and a cap engaging the base to protect laser diodes fixed on the base. The package is generally in the shape of a "can" and is made of a metal material with an opening in a top and an optical glass element attached to cover the opening and permitting passage of laser emissions therethrough.

A conventional semiconductor laser package is disclosed in the U.S. Pat. No. 5,052,009, as shown in FIG. 7. The laser device 10 includes a base 11 and a housing 13 engaging with the base 11 to accommodate laser diodes 14, 15 therebetween. The laser diodes 14, 15 are fixed on the base. A glass plate 16 is attached to an opening in the housing 13 by adhesive resin to form a window 12 in a top portion of the housing 13. However, extra procedures are needed to apply and cure the adhesive resin, and to optimize the glass plate, which is very troublesome and costly in labor. In addition, the adhesive resin is subject to flux during the manufacture, which can lead to contamination of the glass plate and can affect the transparency of the glass plate. Moreover, the adhesive resin is susceptible to degradation, when the window is subjected to mechanical impact or high temperature, which is adverse to the adhesion between the glass plate and the housing.

Accordingly, a low cost semiconductor laser package that is easy to manufacture on a large scale is desired. The copending applications of Ser. Nos. 10/142,448 filed on May 9, 2002 and 10/152,409 filed on May 20, 2002, with the same inventor and the same assignee as the present invention, disclose some approaches.

SUMMARY OF THE INVENTION

An object of the present invention is to provide a low cost lens cap for a semiconductor laser package that is easy to manufacture on a large scale.

Another object of the present invention is to provide a lens cap for a semiconductor laser package having a strong structure.

To achieve the above-mentioned objects, a lens cap for a semiconductor laser package in accordance with a preferred embodiment of the present invention comprises an optical element made of a plastic material and a housing. The housing includes a top portion, a sidewall and a flange. An opening is provided in the top portion. The optical element is insert molded into the housing.

Other objects, advantages and novel features of the present invention will be drawn from the following detailed description of preferred embodiments of the present invention.

DETAILED DESCRIPTION OF THE INVENTION

Figure 1:
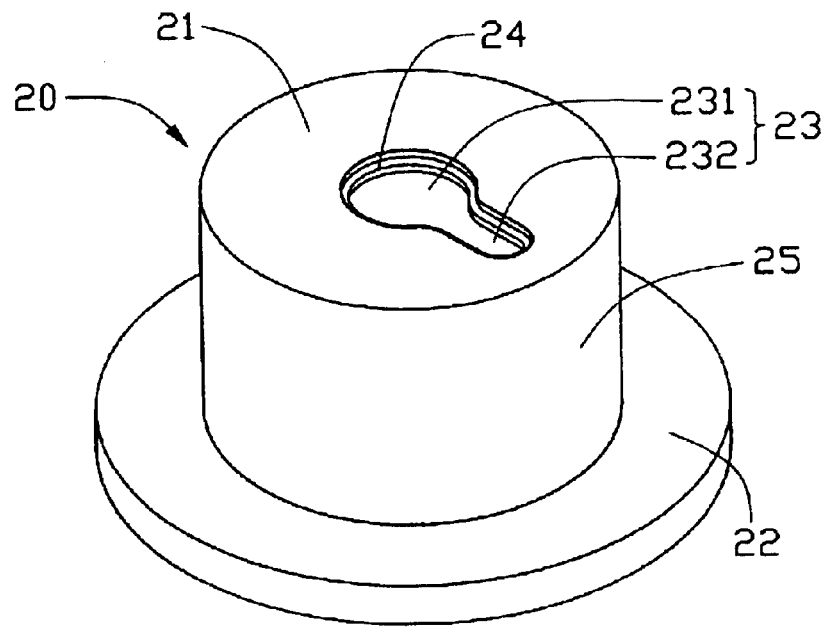
FIG. 1 is a perspective view of a housing of a lens cap for a semiconductor package according to the present invention.
Figure 4:
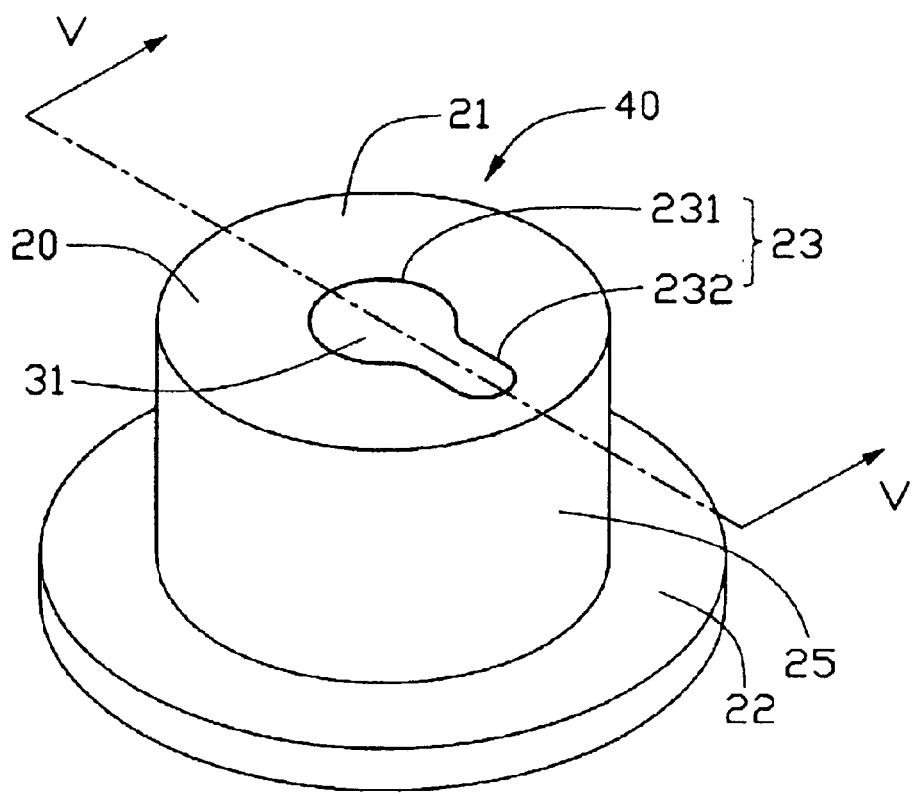
FIG. 4 is a perspective view of the lens cap of the present invention.

Referring to FIG. 4, a lens cap 40 in accordance with a preferred embodiment of the present invention comprises a housing 20 and an optical element 31. The lens cap 40 is used for encapsulating laser diodes (not shown) on a base (not shown). The housing 20 comprises a top portion 21, a cylindrical sidewall 25 connected thereto and an annular flange 22. Referring to FIG. 1, the housing 20 is integrally formed and has the shape of a cylinder. An opening 23 for receiving an optical element is defined through the top portion 21 and comprises a receiving hole 231 permitting passage of laser emissions therethrough and a sprue 232. The receiving hole 231 is in communication with the sprue 232. The annular flange 22 extends outwardly from a lower end of the sidewall 25. The annular flange 22 securely engages with the base (not shown) to accommodate the laser diodes inside the lens cap 40. The housing 20 is made of metal or a plastic material.

Figure 2:
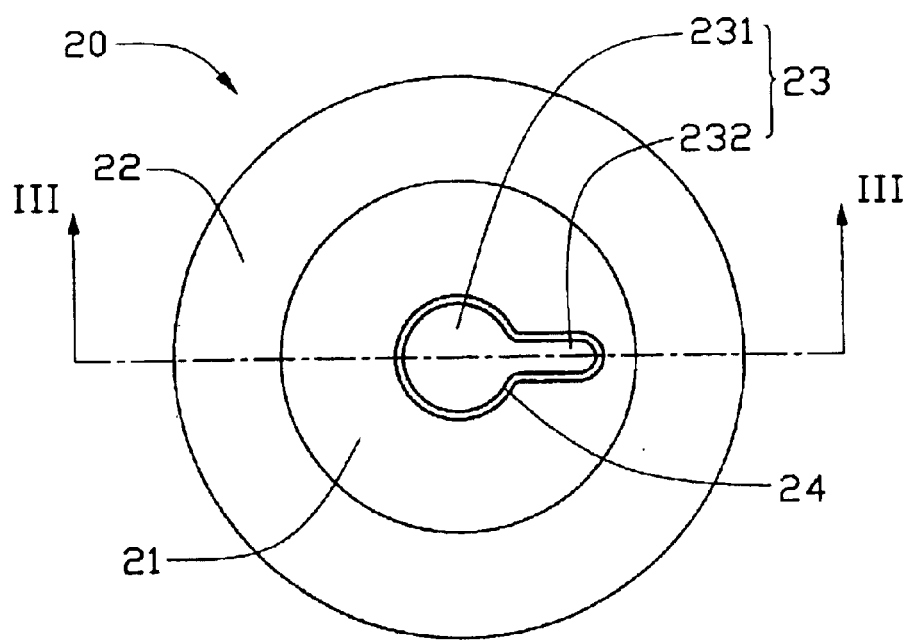
FIG. 2 is a top view of the housing of FIG. 1.
Figure 3:
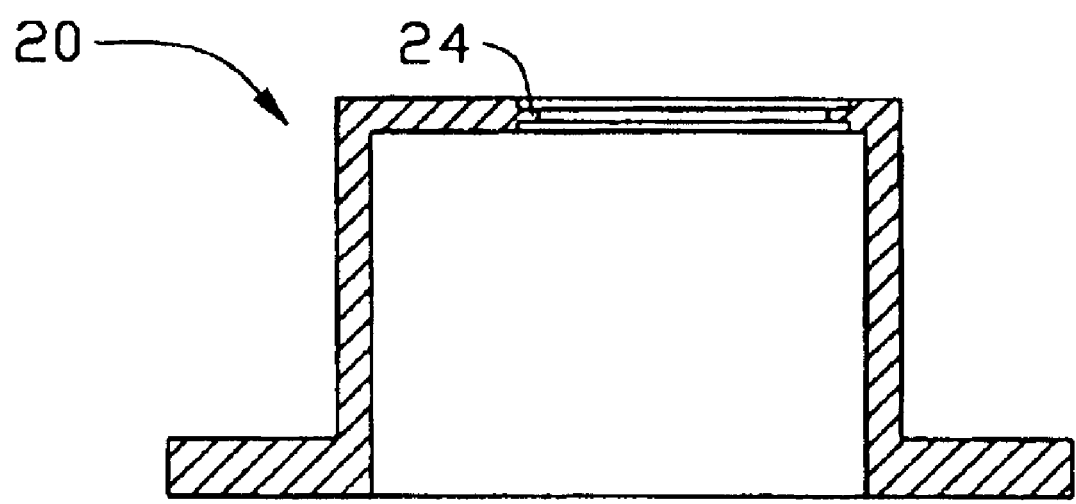
FIG. 3 is a cross-sectional view of the housing of FIG. 1 taken along line III—III of FIG. 2.

Referring now to FIG. 2 and FIG. 3, a ridge 24 is formed along an edge of the opening 23 and protrudes into the opening 23. The ridge 24 extends along the entire periphery of the opening 23. A plurality of ridges can take the place of the continuous ridge 24.

Figure 5:
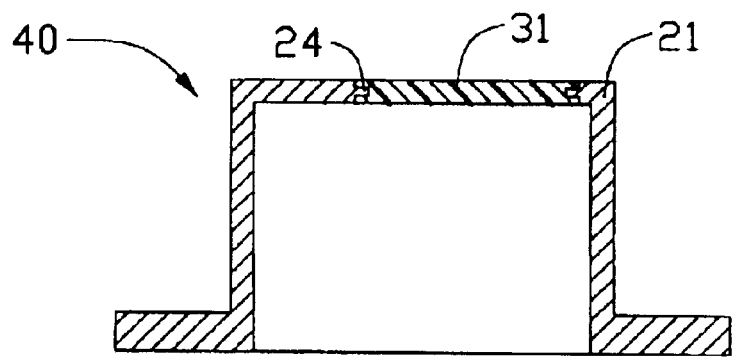
FIG. 5 is a cross-sectional view of the lens cap of FIG. 4 taken along line V—V.

Referring to FIG. 4 and FIG. 5, the optical element 31 of the lens cap 40 is formed in the opening 23 of the housing 20 by plastic injection molding technology to form a sealed window that permits passage of laser emissions therethrough. The optical element 31 is fixed in the housing 20 via engagement with the ridge 24, as shown in cross section in FIG. 5. The optical element 31 is made of a transparent plastic material. A thickness of the optical element 31 is equal to that of the top portion 21 to attain an optimal optical result.

A method of manufacturing the lens cap 40 comprises the following steps of: (1) providing the housing 20 with the opening 23 defined through the top portion 21; (2) placing the housing 20 in a mold (not shown); (3) closing the mold and injecting a melted and transparent plastic resin into the sprue 232 to fill the sprue 232 and the receiving hole 231 to form the one-piece optical element 31; (4) removing the lens cap 40 after curing of the injected plastic resin.

Figure 6:
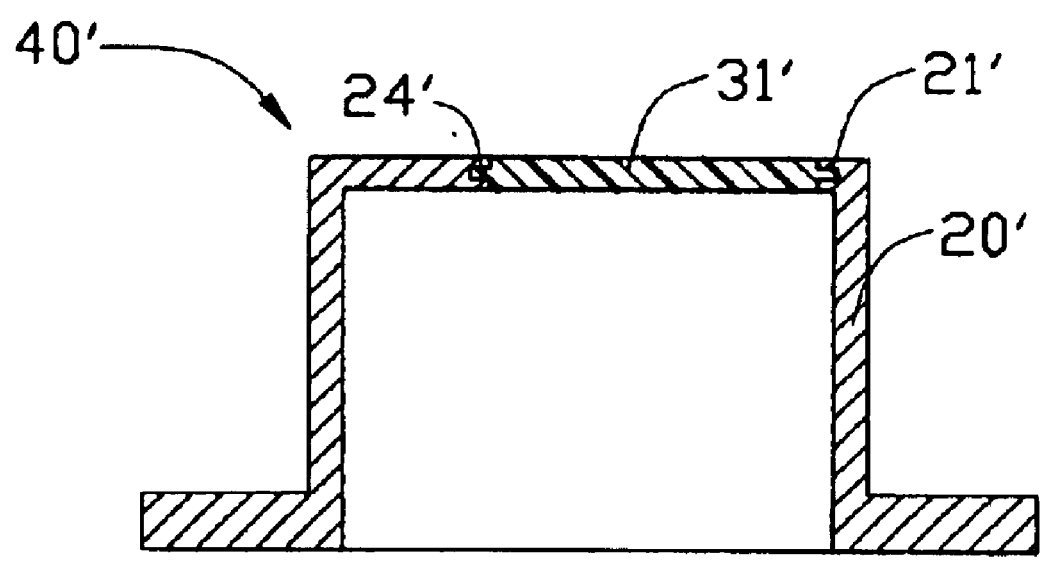
FIG. 6 is a cross-sectional view of a lens cap according to a second embodiment of the present invention.
Figure 7:
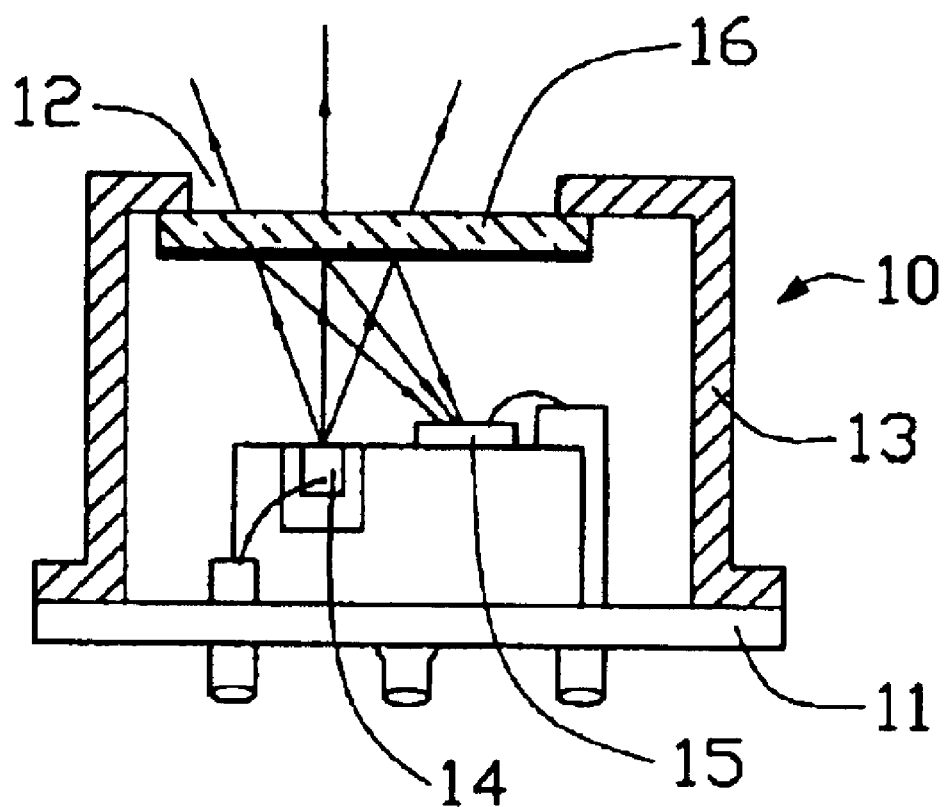
FIG. 7 is a partially cross-sectional view of a conventional semiconductor laser package.

FIG. 6 is a cross-sectional view of a lens cap 40' in accordance with a second embodiment of the present invention. A continuous slot 24' is defined along a periphery of an opening (not labeled) defined in a top portion 21'. The opening (not labeled) has a same shape as the opening 23 of the first embodiment except that the ridge 24 of the first embodiment is replaced by the slot 24' in the second embodiment. The optical element 31' is insert molded with the housing 20' and fills the slot 24'. Of course, a plurality of slots can take the place of the continuous slot 24'.

The lens cap in accordance with the present invention can also be used to encapsulate a photo detector, an optical transceiver module, or other optical elements. The package according to the present invention has many advantages. Since the optical element 31 is insert molded into the top portion 21 of the housing 20, the lens cap 40 has a strong structure and is less easily damaged by impact. In addition, the optical element 31 of the present invention achieves optimal optical characteristics during injection molding and does not require extra manufacturing steps as a glass element mold, so labor costs are reduced, and the manufacturing of the lens cap 40 requires less time due to injection molding technology. Moreover, the optical element is made of a plastic material, which is comparatively inexpensive, therefore the manufacture cost is greatly reduced.

It is believed that the present invention and its advantages will be understood from the foregoing description and it will be apparent that various changes may be made thereto without departing from the spirit and scope of the invention or sacrificing all of its material advantages, the examples hereinbefore described merely being preferred or exemplary embodiments of the invention.

I claim:

1. A lens cap for a semiconductor laser package comprising:
    an optical element made of a plastic material for permitting passage of laser emission therethrough; and
    a housing, including a top portion, an opening being provided in the top portion; wherein
    the optical element is integrally formed with the housing, covering the opening, and the opening comprises a receiving hole for permitting passage of laser light and a sprue in communication with the receiving hole.

2. The lens cap of claim 1, wherein the optical element is made of a transparent plastic material.

3. The lens cap of claim 1, wherein a continuous ridge is formed along a periphery of the opening, and the ridge engages with the optical element insert-molded into the opening.

4. The lens cap of claim 1, wherein a plurality of ridges is formed along a periphery of the opening, and the ridges engage with the optical element insert-molded into the opening.

5. The lens cap of claim 1, wherein a continuous slot is defined along a periphery of the opening, and the continuous slot engagingly receives a part of the optical element insert-molded into the opening.

6. The lens cap of claim 1, wherein a plurality of slots is defined along a periphery of the opening and the slots engagingly receive parts of the optical element insert-molded into the opening.

\* \* \* \* \*